US006990165B2

(12) United States Patent
Boerstler et al.

(10) Patent No.: US 6,990,165 B2
(45) Date of Patent: Jan. 24, 2006

(54) PHASE AND FREQUENCY LOCK DETECTOR

(75) Inventors: David William Boerstler, Round Rock, TX (US); Stephen Douglas Weitzel, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 755 days.

(21) Appl. No.: 10/205,141

(22) Filed: Jul. 25, 2002

(65) Prior Publication Data

US 2004/0017872 A1    Jan. 29, 2004

(51) Int. Cl.
*H03D 3/24*    (2006.01)

(52) U.S. Cl. .................. 375/376; 327/156; 331/DIG. 2
(58) Field of Classification Search ........ 375/373–376; 327/147–153, 156–161; 331/1 R, 17, 25, 331/1 A, DIG. 2; 370/509

See application file for complete search history.

(56) References Cited

U.S. PATENT DOCUMENTS

| 5,175,767 A | * | 12/1992 | Landry ........................ 370/509 |
| 5,602,513 A | * | 2/1997 | De Loe, Jr. ................... 331/25 |
| 5,949,203 A | * | 9/1999 | Buthker ....................... 318/254 |
| 2003/0169836 A1 | * | 9/2003 | Ebuchi et al. .............. 375/373 |

* cited by examiner

*Primary Examiner*—Don N. Vo
(74) *Attorney, Agent, or Firm*—Carr LLP; Diana R. Gerhardt (57) ABSTRACT

A lock detector and method is provided for detecting lock between first and second signals. The lock detector includes a pulse generator for receiving the first signal and generating a pulse train from the first signal. Each pulse corresponds to at least one of rising and falling edges of the first signal in each period of the first signal. The lock detector also includes a mask generator for generating a mask signal from the second signal such that the mask signal has a mask state around at least one of rising and falling edges of the second signal in each period of the second signal. Additionally, the lock detector has a logic gate, which receives the pulse train and the mask signal from the pulse generator and the mask generator, respectively. The logic gate generates an incrementing pulse signal by combining the pulse train with the mask signal.

46 Claims, 7 Drawing Sheets

PHASE AND FREQUENCY LOCK DETECTOR

BACKGROUND OF THE INVENTION

1. Field of the Invention

The invention relates generally to a lock detector and, more particularly, to a lock detector used in conjunction with phase-locked loop or similar oscillation circuits.

2. Description of the Related Art

A phase-locked loop (PLL) may require many thousands or millions of cycles before reaching its steady-state locked condition from its initial power-on state. An indication of the locked condition for the PLL is useful as a diagnostic tool or may be used as part of the power-on-reset sequencing for a system during initial power-up. Conventionally, PLL lock detectors are implemented with two or more large frequency counters, and thus may take up valuable space in a circuit area. Moreover, since both the counters are continuously toggling during steady-state locked conditions, the prior-art PLL lock detectors can dissipate significant power. These large frequency counters may also introduce digital switching noise, which can seriously limit the performance of the sensitive analog components of a mixed-signal PLL design. Some of the prior art specifically detects only frequency lock, a condition necessary for phase lock, rather than a more stringent frequency and phase lock. Other prior-art PLL lock detectors use delay lines, which will limit the frequency range for lock detection and are difficult to manufacture with the appropriate tolerances. Also, some other prior-art PLL lock detectors require low-pass filter components, which may take up significant space in a circuit area and require strict manufacturing process controls.

Therefore, there is a need for a lock detector that takes up less space in a circuit area, consumes less power, and detects lock over a wider range of frequency.

SUMMARY OF THE INVENTION

The present invention provides a lock detector and method for detecting lock between first and second signals. In one embodiment of the invention, a lock detector is provided. The lock detector includes a pulse generator for receiving the first signal and generating a pulse train from the first signal. Each pulse of the pulse train corresponds to at least one of rising and falling edges of the first signal in each period of the first signal. The lock detector also includes a mask generator for generating a mask signal from the second signal such that the mask signal has a mask state around at least one of rising and falling edges of the second signal in each period of the second signal. Additionally, the lock detector has a logical gate coupled to the pulse generator and the mask generator. The logical gate receives the pulse train from the pulse generator and receives the mask signal from the mask generator. The logical gate generates an incrementing pulse signal by combining the pulse train with the mask signal.

In another embodiment of the invention, a method is provided for detecting lock between first and second signals. A pulse train is generated from the first signal. Each pulse of the pulse train corresponds to at least one of rising and falling edges of the first signal in each period of the first signal. Also, a mask signal is generated from the second signal such that the mask signal has a mask state around at least one of rising and falling edges of the second signal in each period of the second signal. Further, an incrementing pulse signal is generated by combining the pulse train with the mask signal. Additionally, lock between the first and second signals is detected from the incrementing pulse signal.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
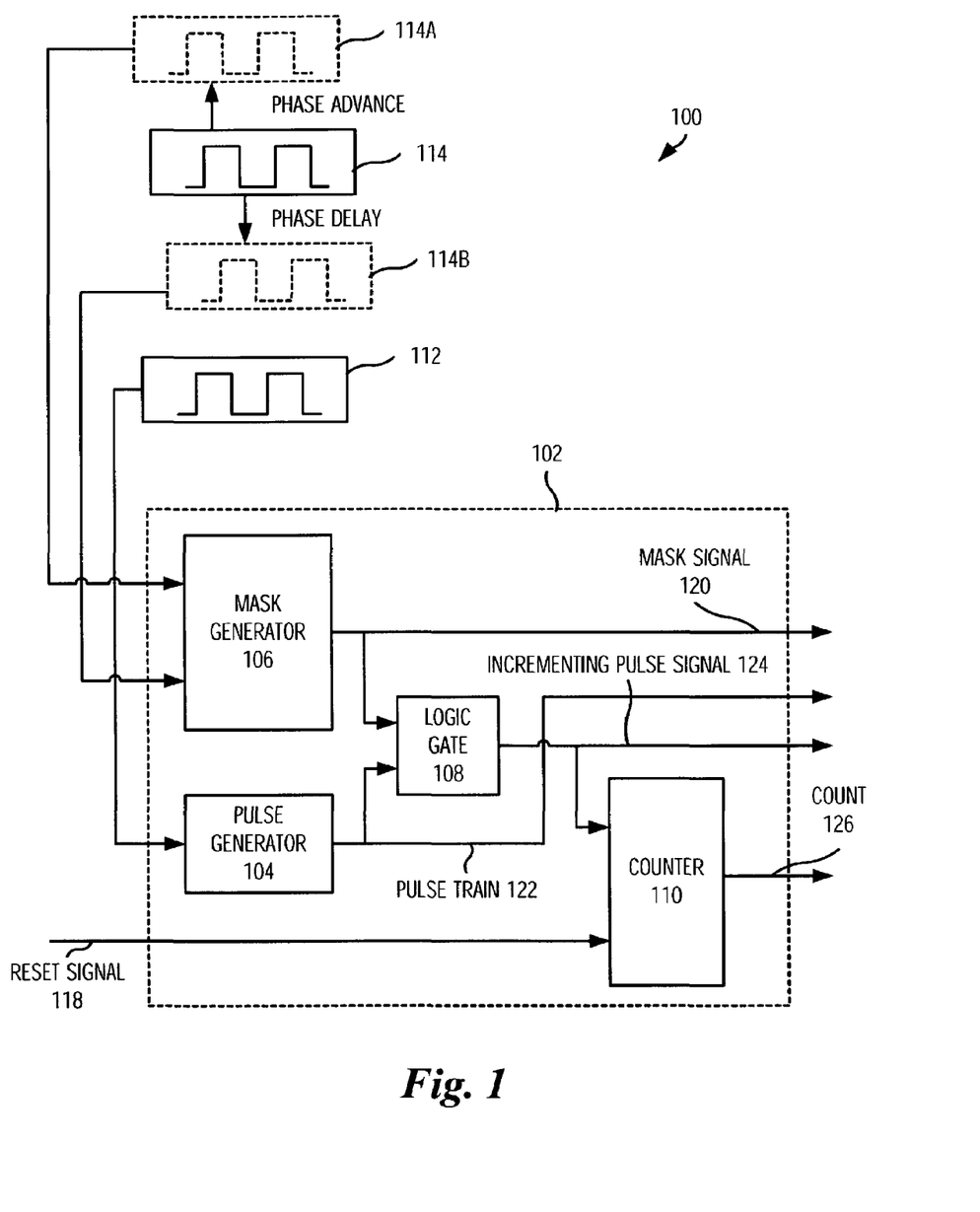
FIG. 1 is a block diagram illustrating a lock detector in accordance with a preferred embodiment of the present invention.

In FIG. 1, a reference numeral 100 designates a block diagram illustrating a lock detector 102 in accordance with a preferred embodiment of the present invention. The lock detector 102 includes a pulse generator 104, a mask generator 106, a logic gate 108, and a counter 110. The lock detector 102 determines whether a first signal 112 and a second signal 114 are locked in phase and frequency. In order for the lock detector 102 to compare the first and second signals 112 and 114, the second signal 114 should be shifted in phase to obtain a phase-advanced second signal 114A and a phase-delayed second signal 114B. Note that the phase-advanced second signal 114A and the phase-delayed second signal 114B are two preferred phase-shifted versions of the second signal 114.

The lock detector 102 receives the first signal 112, the phase-advanced second signal 114A, the phase-delayed second signal 114B, and a reset signal 118. Alternatively, the lock detector 102 may be configured to receive the first and second signals 112 and 114 directly and generate the phase-advanced second signal 114A and the phase-delayed second signal 114B by including a phase shifter (not shown) to shift the phase of the second signal 114 within the lock detector 102. Note that the phase-advanced second signal 114A and the phase-delayed second signal 114B may be further adjusted before connection to the lock detector 102 in order to adjust the performance of the lock detector 102.

The mask generator 106 receives the phase-advanced second signal 114A and the phase-delayed second signal 114B, and generates a mask signal 120. The mask signal 102 is created such that the mask signal 102 is in a mask state while the mask signal 102 corresponds to a rising edge or a falling edge or both edges of the second signal 114. Preferably, the mask state of the mask signal 102 is a low state.

The pulse generator 104 receives the first signal 112 and generates a pulse train 122. The pulse train 122 is created such that each pulse of the pulse train 122 corresponds to a rising edge or a falling edge or both edges of the first signal 112. Preferably, each pulse in the pulse train 122 has a substantially short duration compared to one cycle or period of the first signal 112.

The logic gate 108 is connected to the mask generator 106 and the pulse generator 104 and receives the mask signal 120 and the pulse train 122 from the mask generator 106 and the pulse generator 104, respectively. The logic gate 108 generates an incrementing pulse signal 124 by performing a logic operation on the mask signal 120 and the pulse train 122. The incrementing pulse signal 124 has one or more incrementing pulses and is generated by combining the pulse train 122 with the mask signal 120. Preferably, the logic gate 108 performs an AND logic operation of the mask signal 120 and the pulse train 122, thereby masking any pulse in the pulse train 122 corresponding to a low state of the mask signal 120.

The counter 110 receives the incrementing pulse signal 124 and the reset signal 118 and generates a count 126. The counter 110 increments the count 126 whenever an incrementing pulse is input to the counter 110. Preferably, the count is incremented by one for each incrementing pulse received. The reset signal 118 is used to reset the count 126. During phase and frequency acquisition or failure conditions, the count will increment at least once during a predetermined period of time. During locked conditions, the count will stop incrementing for the predetermined period of time. Preferably, the predetermined period of time is set to be at least more than one cycle of the first clock signal 112 for reliable lock detection.

Figure 2A:
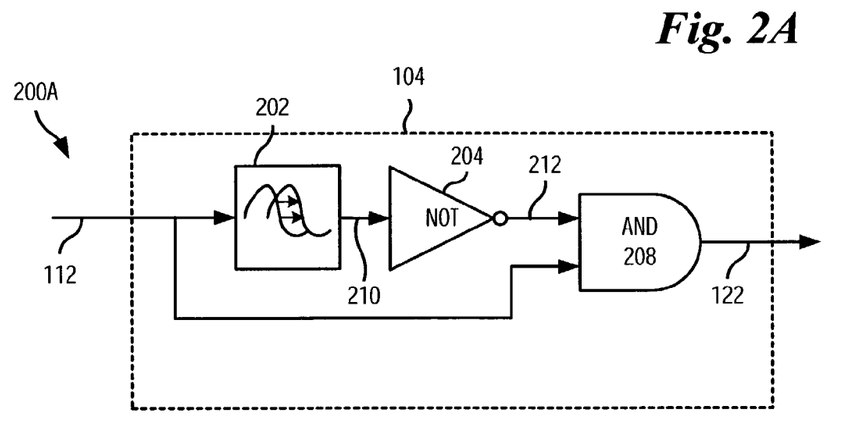
FIG. 2A is a schematic diagram illustrating a pulse generator of FIG. 1 in accordance with a preferred embodiment of the present invention.

In FIG. 2A, a schematic diagram 200A illustrates the pulse generator 104 of FIG. 1 in accordance with a preferred embodiment of the present invention. The pulse generator 104 includes a delay element 202, an inverter 204, and an AND gate 208. The delay element 202 receives the first signal 112 of FIG. 1 and generates a phase-delayed first signal 210. The inverter 204 is coupled to the delay element 202 to receive the phase-delayed first signal 210 and generates an inverted, phase-delayed first signal 212. The AND gate 208 is coupled to the inverter 204 to receive the inverted, phase-delayed first signal 212. The AND gate 208 also receives the first signal 112. Thus, the AND gate performs an AND logical operation of the inverted, phase-delayed first signal 212 and the first signal 112 and generates the pulse train 122 of FIG. 1. The pulse train 122 in this embodiment has a pulse corresponding to every rising edge of the first signal 112 in each period of the first signal 112. The width of the pulse is substantially equal to the amount of the delay of the delay element 202.

Figure 2B:
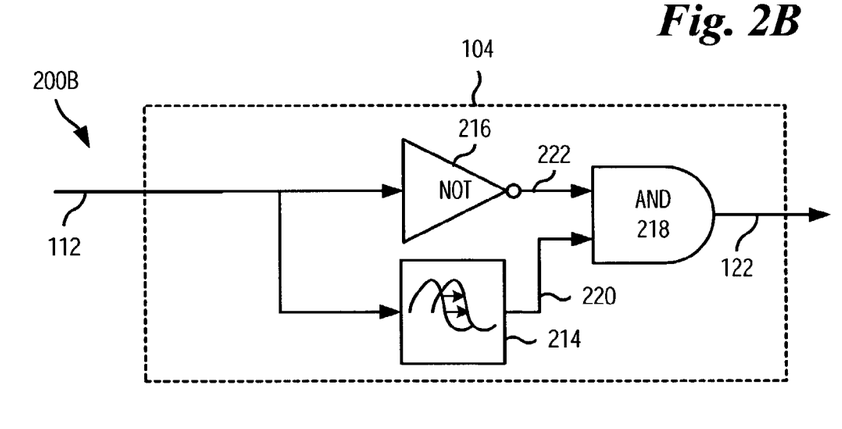
FIG. 2B is another schematic diagram illustrating the pulse generator of FIG. 1 in accordance with a preferred embodiment of the present invention.

In FIG. 2B, another schematic diagram 200B illustrates the pulse generator 104 of FIG. 1 in accordance with a preferred embodiment of the present invention. The pulse generator 104 includes a delay element 214, an inverter 216, and an AND gate 218. The delay element 214 receives the first signal 112 of FIG. 1 and generates a phase-delayed first signal 220. The inverter 216 also receives the first signal 112 and generates an inverted first signal 222. The AND gate 218 is coupled to the delay element 214 to receive the phase-delayed first signal 220. Similarly, the AND gate 218 is coupled to the inverter 216 to receive the inverted first signal 222. Thus, the AND gate performs an AND logical operation of the phase-delayed first signal 220 and the inverted first signal 222 and generates the pulse train 122 of FIG. 1. The pulse train 122 in this embodiment has a pulse corresponding to every falling edge of the first signal 112 in each period of the first signal 112. The width of the pulse is substantially equal to the amount of the delay of the delay element 214.

Figure 3A:
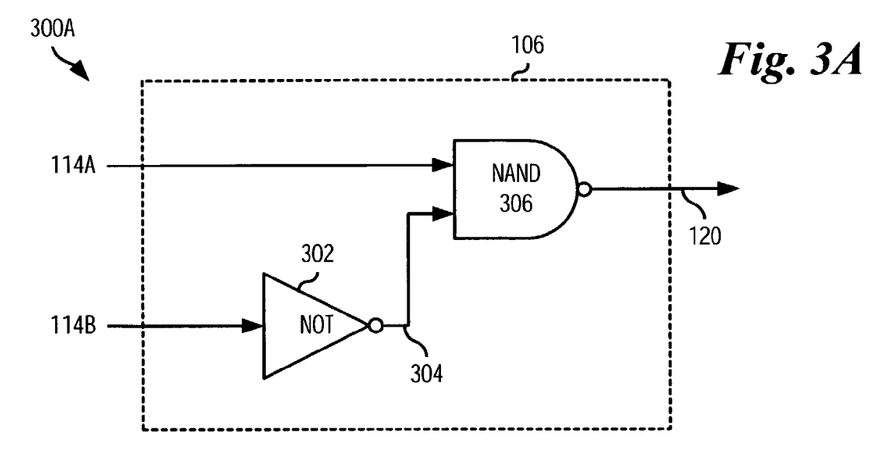
FIG. 3A is a schematic diagram illustrating a mask generator of FIG. 1 in accordance with a preferred embodiment of the present invention.

Now referring to FIG. 3A, a schematic diagram 300A illustrates the mask generator 106 of FIG. 1 in accordance with a preferred embodiment of the present invention. The mask generator 106 includes an inverter 302 for receiving the phase-delayed second signal 114B of FIG. 1 and generating an inverted, phase-delayed second signal 304. The mask generator 106 also includes a NAND gate 306 for receiving the phase-advanced second signal 114A of FIG. 1 and the inverted, phase-delayed second signal 304 and generating the mask signal 120 of FIG. 1.

Figure 3B:
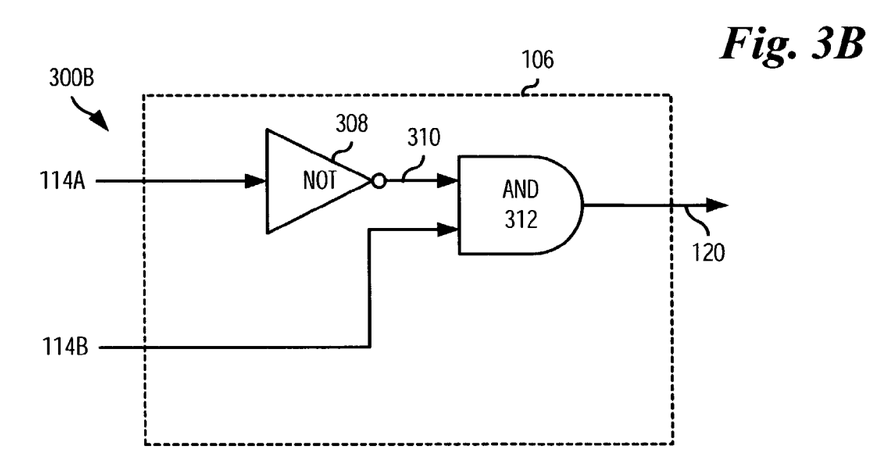
FIG. 3B is another schematic diagram illustrating the mask generator of FIG. 1 in accordance with a preferred embodiment of the present invention.

Alternatively, in FIG. 3B, a schematic diagram 300B illustrates the mask generator 106 of FIG. 1 in accordance with another preferred embodiment of the present invention. The mask generator 106 includes an inverter 308 for receiving the phase-advanced second signal 114A of FIG. 1 and generating an inverted, phase-advanced second signal 310. The mask generator 106 also includes an AND gate 312 for receiving the phase-delayed second signal 114B of FIG. 1 and the inverted, phase-advanced second signal 310 and generating the mask signal 120 of FIG. 1.

Figure 4:
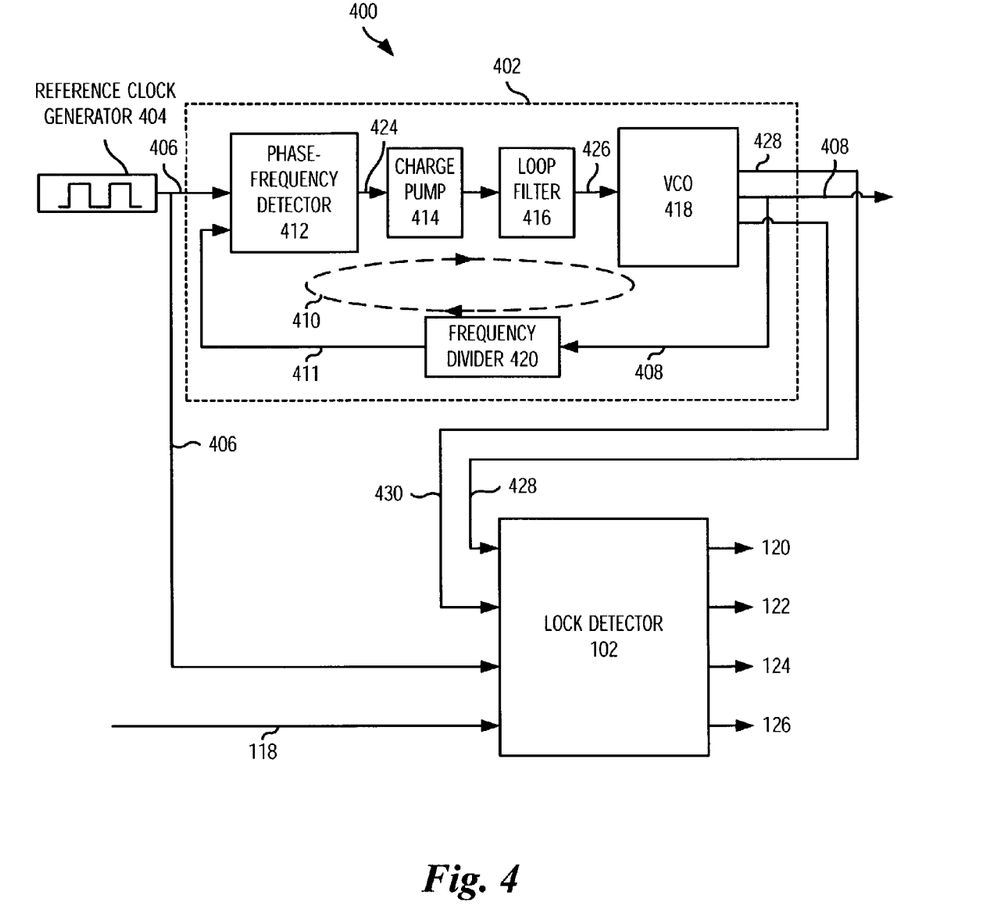
FIG. 4 is a block diagram illustrating the lock detector of FIG. 1 connected to a voltage-controlled oscillator of a phase-locked loop.

Now referring to FIG. 4, a block diagram 400 illustrates the lock detector 102 of FIG. 1 operating in conjunction with a phase-locked loop (PLL) 402. The PLL 402 is coupled to a reference clock generator 404 to receive a reference clock signal 406 and is configured to generate a PLL output signal 408. Generally, the PLL 402 uses a feedback loop 410 to lock a feedback signal 411 to the reference clock signal 406. Note that the reference clock signal 406 and the feedback signal 411 are PLL-specific examples of the first and second signals 112 and 114 of FIG. 1, respectively.

Specifically, the feedback loop 410 includes a phase-frequency detector 412, a charge pump 414, a loop filter 416, a voltage-controlled oscillator (VCO) 418, and optionally a frequency divider 420. The lock detector 102 is coupled to the PLL 402 to receive a phase-advanced PLL output signal 428 and a phase-delayed PLL output signal 430 from the PLL 428. The phase-advanced PLL output signal 428 has substantially the same frequency as that of the PLL output signal 408, but leads the PLL output signal 408 in phase. Similarly, the phase-delayed PLL output signal 430 has substantially the same frequency as that of the PLL output signal 408, but lags behind the PLL output signal 408 in phase. Note that the phase-advanced PLL output signal 428 and the phase-delayed PLL output signal 430 may be further adjusted before connection to the lock detector 102 in order to adjust the performance of the lock detector 102.

The lock detector 102 is also coupled to the reference clock generator 404 to receive the reference clock signal 406. The lock detector 102 therefore detects whether the PLL output signal 408 is locked to the reference clock signal 406.

In the PLL 402, the phase-frequency detector 412 compares the reference clock signal 406 and the feedback signal 411 and generates an error signal 424, which is proportional to the magnitude of the phase and/or frequency difference between the reference clock signal 406 and the feedback signal 411. The error signal 424 is fed to the charge pump 414. The charge pump 414 controls the magnitude of charge stored in the loop filter 416 using current, thereby converting the error signal 424 into a control voltage input 426, which is recognizable by the VCO 418. The VCO 418 generates the PLL output signal 408. Typically, the frequency of the PLL output signal 408 is proportional to the control voltage input 426.

Optionally, the frequency divider 420 further divides down the frequency of the PLL output signal 408 before the PLL output signal 408 is fed back to the phase-frequency detector 412. Provided that the frequency divider 420 is used in the PLL 402, the frequency of the PLL output signal 408 is higher than that of the feedback signal 411 by a factor of the frequency divider 420. For example, if the frequency divider 420 with a factor of four (4) is used, the frequency of the PLL output signal 408 is approximately four times as high as that of the feedback signal 411. This is because the PLL 402 locks the frequency of the feedback signal 411 to that of the reference clock signal 406 in the feedback loop 410. Similarly, provided that the frequency divider 420 is used in the PLL 402, the frequency of the phase-advanced PLL output signal 428 and the phase-delayed PLL output signal 430 is higher than that of the feedback signal 411 by a factor of the frequency divider 420.

Preferably, the VCO 418 generates the phase-advanced PLL output signal 428 and the phase-delayed PLL output signal 430 as well as the PLL output signal 408. Typically, the phase-advanced PLL output signal 428 and the phase-delayed PLL output signal 430 are easily obtained from the VCO 418, provided that the VCO 418 is a multiphase VCO such as a ring-oscillator VCO (not shown). Alternatively to the configuration shown in FIG. 4, a phase shifter (not shown) may be used to generate the phase-advanced PLL output signal 428 and the phase-delayed PLL output signal 430 from the PLL output signal 408. Such a phase shifter may be implemented in the lock detector 102 or the PLL 402 or in between.

The lock detector 102 compares the phase and frequency of the reference clock signal 406 and those of the feedback signal 411, and then generates one or more signals indicating whether the alignment criteria for phase and frequency lock are met. Such one or more signals include the mask signal 120, the pulse train 122, the incrementing pulse signal 124, and the count 126. During phase and frequency acquisition or failure conditions, the count will be incrementing. During locked conditions, the count will stop incrementing for a predetermined period of time. Preferably, the predetermined period of time is set to be at least more than one cycle of the reference clock signal 406 for reliable lock detection.

Figure 5:
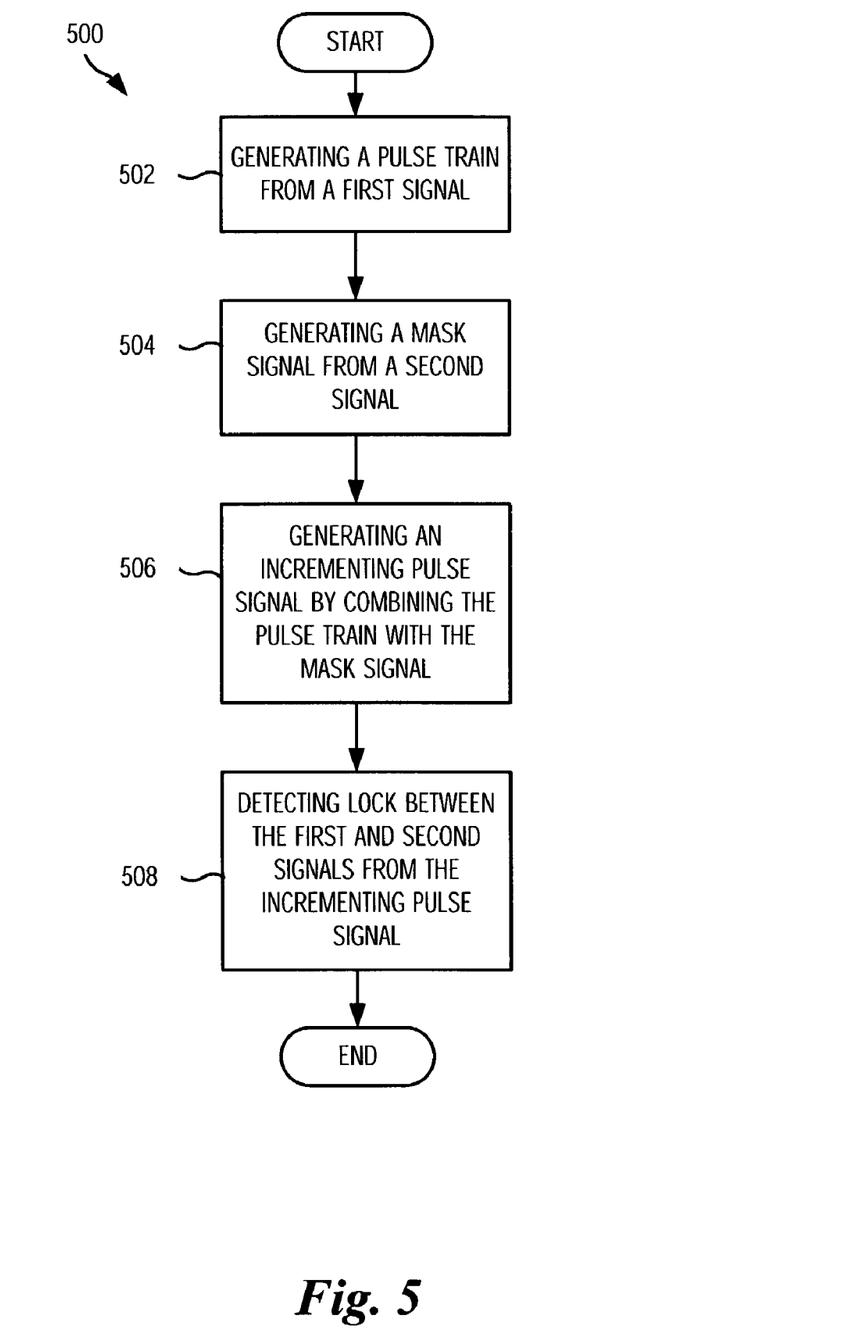
FIG. 5 is a flow diagram illustrating a preferred method for detecting lock between two signals according to the present invention.

Now referring to FIG. 5, a flow diagram 500 illustrates a preferred method for detecting lock between the first and second signals according to the present invention. In step 502, a pulse train is generated from the first signal. Preferably, a pulse generator, such as the pulse generator 104 of FIG. 1, generates the pulse train from the first signal. Specifically, each pulse of the pulse train corresponds to at least one of rising and falling edges of the second signal in each period of the first signal.

In step 504, a mask signal is generated from the second signal. Preferably, a mask generator such as the mask generator 106 of FIG. 1 generates the mask signal from the second signal. Specifically, the mask signal has a mask state around at least one of rising and falling edges of the second signal in each period of the second signal.

In step 506, an incrementing pulse signal is generated by combining the pulse train with the mask signal. Preferably, a logic gate such as the logic gate 108 of FIG. 1 generates the incrementing pulse signal. The incrementing pulse signal has one or more incrementing pulses.

In step 508, lock between the first and second signals is detected from the incrementing pulse signal. Preferably, a counter such as the counter 110 of FIG. 1 is used to generate a count from the incrementing pulse signal and to detect lock between the first and second signals from a history of the count over a predetermined period of time. Preferably, the predetermined period of time is set to be at least more than one cycle of the first clock signal for reliable lock detection.

Figure 6A:
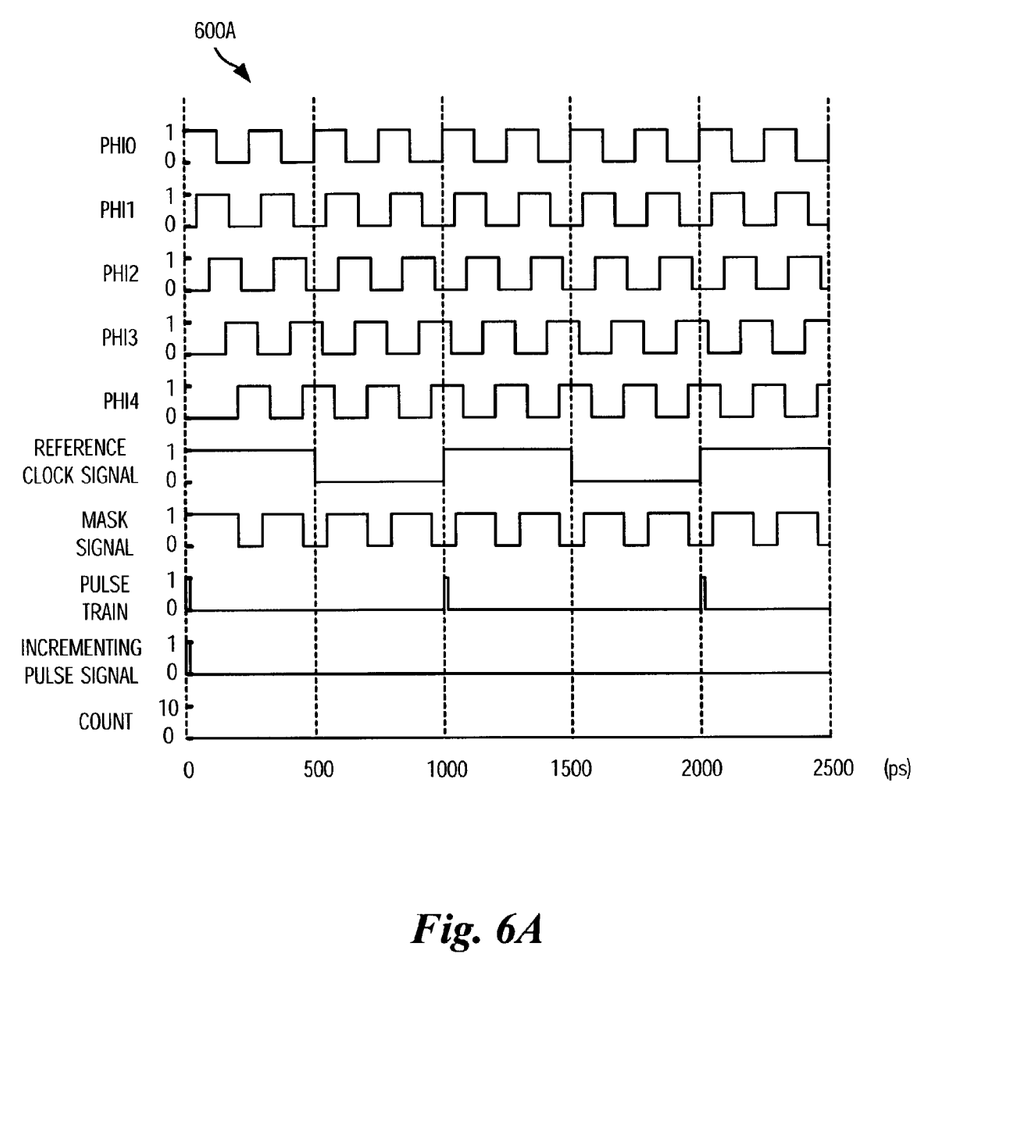
FIG. 6A is a timing diagram depicting various signals when a phase-locked loop as shown in FIG. 4 is in a locked condition.

Now referring to FIG. 6A, a timing diagram 600A depicts various signals when a phase-locked loop, as shown in FIG. 4, is in a locked condition. Specifically, the timing diagram 600A depicts various signals measured in the block diagram 400 of FIG. 4 in which the frequency divider 420 of FIG. 4 divides the frequency of the PLL output signal 408 by four (4). Also, it is assumed that the frequency of the PLL output signal 408 would be 4 GHz for a 1 GHz reference clock signal at steady-state, locked conditions. The timing diagram 600A includes five phases of the VCO 418, namely, phi0, phi1, phi2, phi3, and phi4 signals. The timing diagram 600A also depicts a reference clock signal, a mask signal, a pulse train, an incrementing pulse signal, and a count. In this example, the Phi1 and Phi4 signals correspond to the phase-delayed PLL output signal 430 of FIG. 4 and the phase-advanced PLL output signal 428 of FIG. 4, respectively. Preferably, the mask signal is generated from the phi4 and phi1 signals. The pulse train generated from the rising edge of the reference clock signal is effectively blocked by the mask signal. This prevents the incrementing pulse signal from pulsing, thereby freezing the count.

Figure 6B:
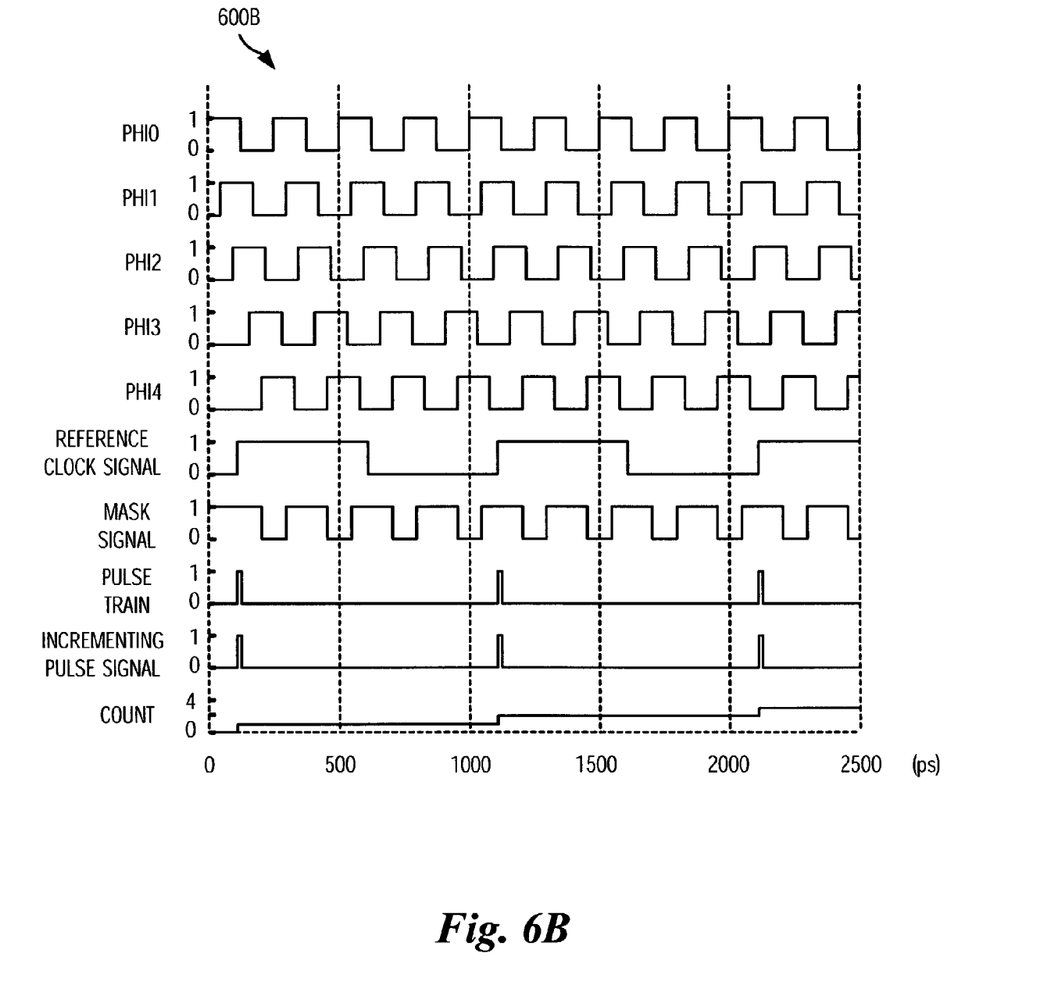
FIG. 6B is a timing diagram depicting various signals when a phase-locked loop as shown in FIG. 4 is in either a phase and frequency acquisition condition or a failure condition.

Similarly in FIG. 6B, a timing diagram 600B depicts various signals when a phase-locked loop, as shown in FIG. 4, is in either a phase and frequency acquisition condition or a failure condition. The timing diagram 600B depicts the same situation as in the timing diagram 600A, except that the reference clock signal is shifted substantially in phase with respect to a phi0 signal. The pulse train generated from the rising edge of the reference clock signal is propagated past the mask signal. This creates pulses in the incrementing pulse signal, thereby causing the count to increment steadily until both phase and frequency errors are substantially small, at which point the count remains constant.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A lock detector for detecting lock between first and second signals, the lock detector comprising:
   a pulse generator for receiving the first signal and generating a pulse train from the first signal, each pulse of the pulse train corresponding to at least one of rising and falling edges of the first signal in each period of the first signal;
   a mask generator for generating a mask signal from the second signal such that the mask signal has a mask state around at least one of rising and falling edges of the second signal in each period of the second signal; and
   a logical gate coupled to the pulse generator and the mask generator, the logical gate receiving the pulse train from the pulse generator and receiving the mask signal from the mask generator, the logical gate generating an incrementing pulse signal having one or more incrementing pulses by combining the pulse train with the mask signal.

2. The lock detector of claim 1, wherein the incrementing pulse signal characterizes lock between the first and second signals by having no incrementing pulse for a predetermined period of time.

3. The lock detector of claim 1, wherein the incrementing pulse signal characterizes unlock between the first and second signals by having at least one incrementing pulse for a predetermined period of time.

4. The lock detector of claim 1, further comprising:
   a counter coupled to the logical gate, the counter receiving the incrementing pulse signal from the logical gate and generating a count, the count being incremented for each incrementing pulse inputted to the counter.

5. The lock detector of claim 4, wherein the count characterizes lock between the first and second signals by having no increment in count for a predetermined period of time.

6. The lock detector of claim 4, wherein the count characterizes unlock between the first and second signals by having at least one increment for a predetermined period of time.

7. The lock detector of claim 1, wherein the pulse generator is configured for generating the pulse train corresponding to the rising edge of the first signal in each period of the first signal.

8. The lock detector of claim 1, wherein the pulse generator is configured for generating the pulse train corresponding to the rising edge of the first signal in each period of the first signal, and wherein the pulse generator comprises:
   delaying means for receiving the first signal and generating a delayed first signal;
   an inverter coupled to the delaying means, the inverter receiving the delayed first signal and generating a delayed and inverted first signal; and
   an AND logical means configured for receiving the first signal and coupled to the inverter, the AND logical means receiving the delayed and inverted first signal from the inverter and generating the pulse train.

9. The lock detector of claim 1, wherein the pulse generator is configured for generating the pulse train corresponding to the rising edge of the first signal in each period of the first signal, and wherein the pulse generator comprises:
   an inverter for receiving the first signal and generating an inverted first signal;
   delaying means coupled to the inverter, the delaying means receiving the inverted first signal from the inverter and generating a delayed and inverted first signal; and
   an AND logical means configured for receiving the first signal and coupled to the delaying means, the AND logical means receiving the delayed and inverted first signal from the delaying means and generating the pulse train.

10. The lock detector of claim 1, wherein the pulse generator is configured for generating the pulse train corresponding to the falling edge of the first signal in each period of the first signal.

11. The lock detector of claim 1, wherein the pulse generator is configured for generating the pulse train corresponding to the falling edge of the first signal in each period of the first signal, and wherein the pulse generator comprises:
    delay means for receiving the first signal and generating a delayed first signal;
    an inverter for inverting the first signal and generating an inverted first signal; and
    an AND logical means coupled to the delay means and the inverter, the AND logical means receiving the delayed first signal from the delay means, receiving the inverted first signal from the inverter, and generating the pulse train.

12. The lock detector of claim 1, wherein the mask generator is configured for generating the mask signal from third and fourth signals, each of which signals is derived from the second signal by shifting the phase of the second signal.

13. The lock detector of claim 12, wherein the mask signal is obtained from a NAND logical operation of the third signal and an inverted version of the fourth signal.

14. The lock detector of claim 12, wherein the third signal is a phase-advanced version of the second signal and the fourth signal is a phase-delayed version of the second signal.

15. The lock detector of claim 12, wherein the mask generator comprises:
    an inverter for receiving the fourth signal and generating a fifth signal; and
    a NAND logical means for receiving the third and fifth signals and generating the mask signal.

16. The lock detector of claim 12, wherein the mask generator comprises:
    an inverter for receiving the third signal and generating an inverted third signal; and
    an AND logical means coupled to the inverter, the AND logical means receiving the inverted third signal from the inverter, receiving the fourth signal, and generating the mask signal.

17. The lock detector of claim 1, wherein the mask state is a low state.

18. The lock detector of claim 1, wherein the logical gate includes an AND logical means.

19. A lock detector coupled to a phase-locked loop (PLL), the PLL being configured for receiving a reference signal and locking a feedback signal to the reference signal, the lock detector being configured for detecting lock between the reference and feedback signals, the lock detector comprising:
    a pulse generator configured for generating a pulse train from the reference signal, each pulse of the pulse train corresponding to at least one of rising and falling edges of the reference signal in each period of the reference signal;

a mask generator coupled to the PLL for receiving at least a PLL output signal and generating a mask signal from the PLL output signal such that the mask signal has a mask state around at least one of rising and falling edges of the feedback signal in each period of the feedback signal, wherein the PLL output signal is substantially in phase with the feedback signal; and a logical gate coupled to the pulse generator and the mask generator, the logical gate receiving the pulse train from the pulse generator and receiving the mask signal from the mask generator, the logical gate generating an incrementing pulse signal having one or more incrementing pulses by combining the pulse train with the mask signal.

20. The lock detector of claim 19, wherein the incrementing pulse signal characterizes lock between the reference and feedback signals by having no incrementing pulse for a predetermined period of time.

21. The lock detector of claim 19, wherein the incrementing pulse signal characterizes unlock between the reference and feedback signals by having at least one incrementing pulse for a predetermined period of time.

22. The lock detector of claim 19, further comprising:
a counter coupled to the logical gate, the counter receiving the incrementing pulse signal from the logical gate and generating a count, the count being incremented for each incrementing pulse inputted to the counter.

23. The lock detector of claim 22, wherein the count characterizes lock between the reference and feedback signals by having no increment in count for a predetermined period of time.

24. The lock detector of claim 22, wherein the count characterizes unlock between the reference and feedback signals by having at least one increment for a predetermined period of time.

25. The lock detector of claim 19, wherein the pulse generator is configured for generating the pulse train corresponding to the rising edge of the reference signal in each period of the reference signal.

26. The lock detector of claim 19, wherein the pulse generator is configured for generating the pulse train corresponding to the rising edge of the reference signal in each period of the reference signal, and wherein the pulse generator comprises:
delaying means for receiving the reference signal and generating a delayed reference signal;
an inverter coupled to the delaying means, the inverter receiving the delayed reference signal and generating a delayed and inverted reference signal; and
an AND logical means configured for receiving the reference signal and coupled to the inverter, the AND logical means receiving the delayed and inverted reference signal from the inverter and generating the pulse train.

27. The lock detector of claim 19, wherein the pulse generator is configured for generating the pulse train corresponding to the rising edge of the reference signal in each period of the reference signal, and wherein the pulse generator comprises:
an inverter for receiving the reference signal and generating an inverted reference signal;
delaying means coupled to the inverter, the delaying means receiving the inverted reference signal from the inverter and generating a delayed and inverted reference signal; and
an AND logical means configured for receiving the reference signal and coupled to the delaying means, the AND logical means receiving the delayed and inverted reference signal from the delaying means and generating the pulse train.

28. The lock detector of claim 19, wherein the pulse generator is configured for generating the pulse train corresponding to the falling edge of the reference signal in each period of the reference signal.

29. The lock detector of claim 19, wherein the pulse generator is configured for generating the pulse train corresponding to the falling edge of the reference signal in each period of the reference signal, and wherein the pulse generator comprises:
delay means for receiving the reference signal and generating a delayed reference signal;
an inverter for inverting the reference signal and generating an inverted reference signal; and
an AND logical means coupled to the delay means and the inverter, the AND logical means receiving the delayed reference signal from the delay means, receiving the inverted reference signal from the inverter, and generating the pulse train.

30. The lock detector of claim 19, wherein the mask generator is configured for generating the mask signal from first and second signals, each of which signals is derived from the feedback signal by shifting the phase of the feedback signal.

31. The lock detector of claim 30, wherein the mask signal is obtained from a NAND logical operation of the first signal and an inverted version of the second signal.

32. The lock detector of claim 30, wherein the first signal is a phase-advanced version of the feedback signal and the second signal is a phase-delayed version of the feedback signal.

33. The lock detector of claim 30, wherein the mask generator comprises:
an inverter for receiving the second signal and generating a third signal; and
a NAND logical means for receiving the first and third signals and generating the mask signal.

34. The lock detector of claim 30, wherein the mask generator comprises:
an inverter for receiving the first signal and generating an inverted first signal; and
an AND logical means coupled to the inverter, the AND logical means receiving the inverted first signal from the inverter, receiving the second signal, and generating the mask signal.

35. The lock detector of claim 19, wherein the mask state is a low state.

36. The lock detector of claim 19, wherein the logical gate includes an AND logical means.

37. The lock detector of claim 19, wherein the PLL comprises a VCO, and wherein the mask generator is configured for generating the mask signal from first and second signals, each of which signals is received from the VCO.

38. The lock detector of claim 37, wherein the VCO comprises a ring oscillator.

39. A method for detecting lock between first and second signals, the method comprising the steps of:
generating a pulse train from the first signal, each pulse of the pulse train corresponding to at least one of rising and falling edges of the first signal in each period of the first signal;
generating a mask signal from the second signal such that the mask signal has a mask state around at least one of rising and falling edges of the second signal in each period of the second signal;

generating an incrementing pulse signal having one or more incrementing pulses by combining the pulse train with the mask signal; and detecting lock between the first and second signals from the incrementing pulse signal.

40. The method of claim 39, wherein the step of detecting lock between the first and second signals from the incrementing pulse signal further comprises the steps of:

generating a count from the incrementing pulse signal, the count being incremented for each incrementing pulse; and detecting lock between the first and second signals from a history of the count over a predetermined period of time.

41. A method for detecting lock between a reference signal inputted to a phase-locked loop (PLL) and a feedback signal in the PLL, the method comprising the steps of:

generating a pulse train from the reference signal, each pulse of the pulse train corresponding to at least one of rising and falling edges of the reference signal in each period of the reference signal;

generating a mask signal from the PLL output signal such that the mask signal has a mask state around at least one of rising and falling edges of the feedback signal in each period of the feedback signal, wherein the PLL output signal is substantially in phase with the feedback signal;

generating an incrementing pulse signal having one or more incrementing pulses by combining the pulse train with the mask signal; and detecting lock between the reference and feedback signals from the incrementing pulse signal.

42. The method of claim 41, wherein the step of detecting lock between the reference and feedback signals from the incrementing pulse signal further comprises the steps of:

generating a count from the incrementing pulse signal, the count being incremented for each incrementing pulse; and detecting lock between the first and second signals from a history of the count over a predetermined period of time.

43. A computer program product for detecting lock between first and second signals, the computer program product having a medium with a computer program embodied thereon, the computer program comprising:

computer program code for generating a pulse train from the first signal, each pulse of the pulse train corresponding to at least one of rising and falling edges of the first signal in each period of the first signal;

computer program code for generating a mask signal from the second signal such that the mask signal has a mask state around at least one of rising and falling edges of the second signal in each period of the second signal;

computer program code for generating an incrementing pulse signal having one or more incrementing pulses by combining the pulse train with the mask signal; and computer program code for detecting lock between the first and second signals from the incrementing pulse signal.

44. The computer program product of claim 43, wherein the computer program code for detecting lock between the first and second signals from the incrementing pulse signal further comprises:

computer program code for generating a count from the incrementing pulse signal, the count being incremented for each incrementing pulse; and computer program code for detecting lock between the first and second signals from a history of the count over a predetermined period of time.

45. A computer program product for detecting lock between a reference signal inputted to a phase-locked loop (PLL) and a feedback signal in the PLL, the computer program product having a medium with a computer program embodied thereon, the computer program comprising:

computer program code for generating a pulse train from the reference signal, each pulse of the pulse train corresponding to at least one of rising and falling edges of the reference signal in each period of the reference signal;

computer program code for generating a mask signal from the PLL output signal such that the mask signal has a mask state around at least one of rising and falling edges of the feedback signal in each period of the feedback signal, wherein the PLL output signal is substantially in phase with the feedback signal;

computer program code for generating an incrementing pulse signal having one or more incrementing pulses by combining the pulse train with the mask signal; and computer program code for detecting lock between the reference and feedback signals from the incrementing pulse signal.

46. The computer program product of claim 45, wherein the computer program code for detecting lock between the reference and feedback signals from the incrementing pulse signal further comprises:

computer program code for generating a count from the incrementing pulse signal, the count being incremented for each incrementing pulse; and computer program code for detecting lock between the first and second signals from a history of the count over a predetermined period of time.

* * * * *